United States Patent
Sakaguchi et al.

(10) Patent No.: US 6,313,014 B1
(45) Date of Patent: Nov. 6, 2001

(54) SEMICONDUCTOR SUBSTRATE AND MANUFACTURING METHOD OF SEMICONDUCTOR SUBSTRATE

(75) Inventors: Kiyofumi Sakaguchi, Yokohama; Nobuhiko Sato, Sagamihara, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/332,102

(22) Filed: Jun. 14, 1999

(30) Foreign Application Priority Data

Jun. 18, 1998 (JP) .................................................. 10-171402
Jun. 3, 1999 (JP) .................................................. 11-156442

(51) Int. Cl.$^7$ .................................................. H01L 29/72
(52) U.S. Cl. .................. 438/475; 438/423; 438/514; 438/526; 257/347
(58) Field of Search ........................... 257/347; 438/423, 438/475, 514, 526

(56) References Cited

U.S. PATENT DOCUMENTS

| 5,310,689 | 5/1994 | Tomozane et al. ............. 437/24 |
| 5,458,755 | 10/1995 | Fujiyama et al. ........... 204/224 R |
| 5,869,387 | * 2/1999 | Sato et al. ...................... 438/459 |

FOREIGN PATENT DOCUMENTS

| 0 553 852 A2 | 8/1993 | (EP) . |
| 0 595 233 A2 | 5/1994 | (EP) . |
| 0 697 713 A1 | 2/1996 | (EP) . |
| 0 817 248 A2 | 1/1998 | (EP) . |
| 0 834 344 A2 | 4/1998 | (EP) . |
| 64(1)-72533 | 3/1989 | (JP) . |
| 7-263538 | 10/1995 | (JP) . |
| 8-46161 | 2/1996 | (JP) . |
| 62-123098 | 6/1996 | (JP) . |
| 10-41241 | 2/1998 | (JP) . |

OTHER PUBLICATIONS

Extended Abstracts; J.P. Ziegler et al.; "ECSTM Studies of Reversible Electrodeposition Materials"; vol. 95–2, Oct. 8–13, 1995, p. 596.

Journal of Crystal Growth; Contents: Single–Crystal Silicon on Non–Single–Crystal Insulators; Introduction; vol. 63 (1983), No. 3; (G. W. Cullen ed.). Jan.

Journal of Crystal Growth; G.K. Celler; "Laser Crystallization of Thin Si Films on Amorphous Insulating Substrates"; vol. 63 (1983), pp. 429–444. Jan.

Journal of Crystal Growth; J.A. Knapp et al; "Growth of Si on Insulators using Electron Beams"; vol. 63 (1983), pp. 445–452. Jan.

Journal of Crystal Growth; J.C.C. Fan et al.; "Graphite–Strip–Heater Zone–Melting Recrystallization of Si Films"; vol. 63 (1983), pp. 453–483. Jan.

Journal of Crystal Growth; McD. Robinson et al.; "Large Area Recrystallization of Polysilicon with Tungsten–Halogen Lamps"; vol. 63 (1983), pp. 484–492. Jan.

Journal of Crystal Growth; L. Jastrzebski; "Soi By CVD: Epitaxial Lateral Overgrowth (ELO) Process—Review"; vol. 63 (1983), pp. 493–526. Jan.

(List continued on next page.)

*Primary Examiner*—Edward Wojciechowicz
(74) *Attorney, Agent, or Firm*—Fitzpatrick, Cella, Harper & Scinto

(57) ABSTRACT

A single-crystal silicon substrate having a surface layer which has been heat-treated in a reducing atmosphere containing hydrogen is prepared. An ion-implantation layer is formed by implanting oxygen ions. Subsequently, a buried oxide film (BOX) layer is formed by a desired heat-treatment utilizing the ion-implantation layer. An SOI substrate having a single-crystal silicon layer (SOI layer) which is formed on the BOX layer and has a remarkably reduced number of defects such as COPs is obtained.

55 Claims, 10 Drawing Sheets

OTHER PUBLICATIONS

Journal of Crystal Growth; H.I. Smith et al.; "silicon–On–Insulator by Graphoepitaxy and Zone–Melting Recrystallization of Patterned Films"; vol. 63 (1983), pp. 527–546. Jan.

Journal of Crystal Growth; K. Imai et al.; "Crystalline Quality of Silicon Layer Formed by Fipos Technology"; vol. 63 (1983), pp. 547–553. Jan.

Journal of Crystal Growth; H.W. Lam et al.; "Silicon–On–Insulator by Oxygen Ion Implantation"; vol. 63 (1983), pp. 554–558. Jan.

Journal of Crystal Growth; R.F. Pinizzotto; "Microstructural Defects in Laser Recrystallized, Graphite Strip Heater Recrystallized and Buried Oxide Silicon–On–Insulator Systems: A Status Report"; vol. 63 (1983), pp. 559–582. Jan.

Jingbao Liu et al: "Formation of Buried Oxide in Siliconusing Separation by Plasma Implantation of Oxygen", Applied Physics Letters, vol. 67, No1. 16, Oct. 16, 1995, pp. 2361–2363.

K. Izumi, et al., Electronics Letters, vol. 14, No. 18 (1978), pp. 593–94.

H. Yamamoto, Oyo–Buturi (Applied Physics), 66 (1997), pp. 662–672.

"Silicon Kesshou –Wafer Gijutsu no Kadai" ("Problems on Silicon Wafers"), Realize Co., Ltd., pp. 55–58.

K. Kashima, "Super Hi Wafer," Denshi–Zairyo (Electronic Materials), (Jun. 1998), pp. 22–26.

Nikkei Microdevices, (Feb. 1998), pp. 30–31.

* cited by examiner

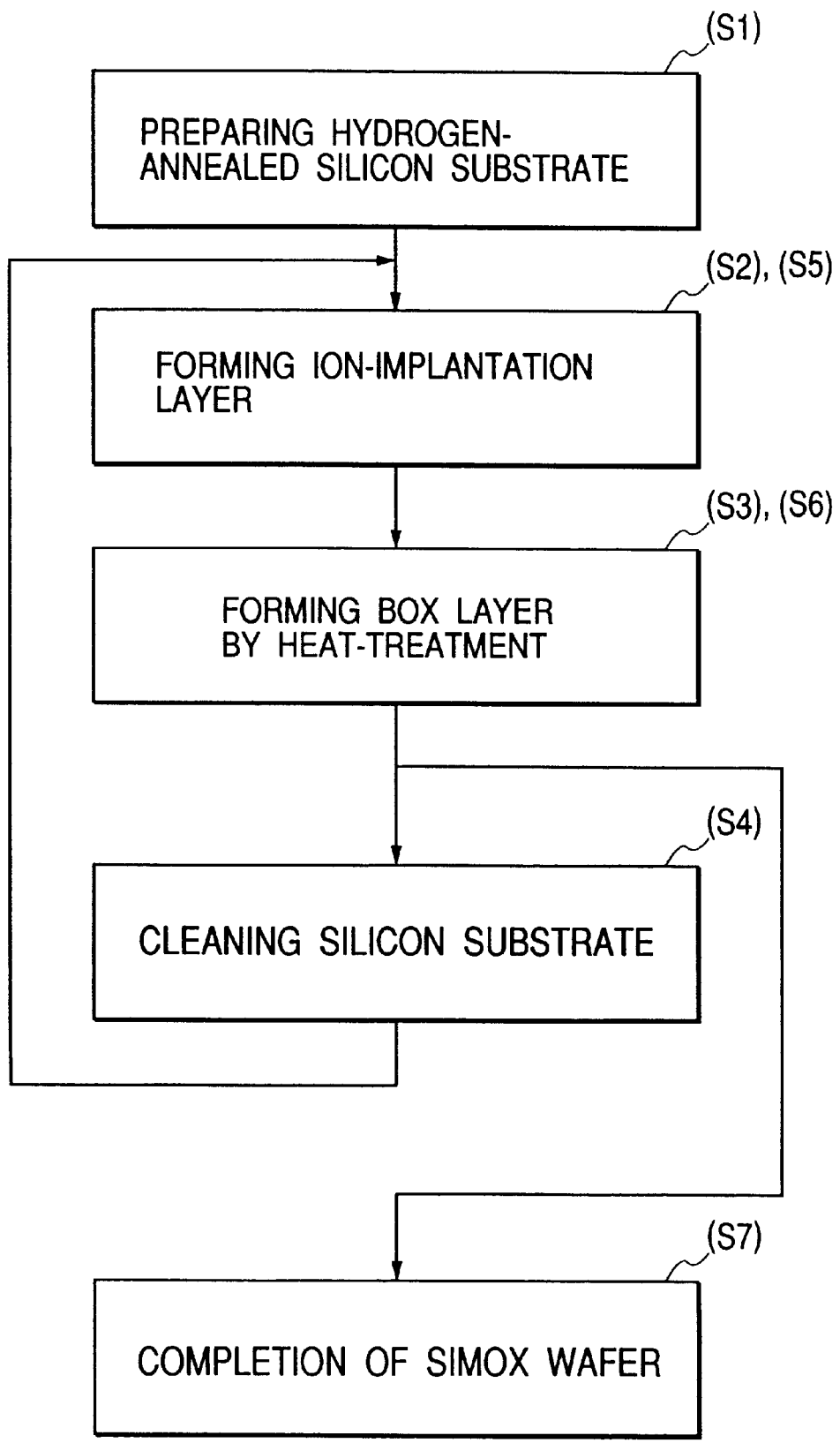

SEMICONDUCTOR SUBSTRATE AND MANUFACTURING METHOD OF SEMICONDUCTOR SUBSTRATE

BACKGROUND OF THE INVENTION

1. Field of the Invention

The present invention relates to a semiconductor substrate and a method to manufacture a semiconductor substrate, and more specifically to a method to manufacture an SOI (Silicon On Insulator) substrate which has a single-crystal silicon layer on an insulating layer and an SOI substrate manufactured by the method. The present invention relates in particular to an SOI substrate which is manufactured by a method referred to as SIMOX (Separation by Implanted Oxygen) method.

2. Related Background Art

Many researches have been made on formation of single-crystal silicon semiconductor layers on an insulating material since it is widely known as a silicon on insulator (SOI) technique and provides devices which have merits unavailable with ordinary bulk silicon substrates used to manufacture silicon integrated circuits. Speaking concretely, the SOI technique makes it possible to:

1. Facilitate to separate dielectric materials and highly integrate circuits.
2. Obtain excellent resistance to radiation.
3. Reduce floating capacities and accelerate speeds.
4. Omit well process.
5. Prevent latchup.
6. Manufacture completely depletion-mode field effect transistors by thinning silicon layers.

(These merits are described detailedly, for example, in Special Issue: "Single-crystal silicon on non-single-crystal insulators", edited by G. W. Cullen, Journal of Crystal Growth, Volume 63, No. 3, pp. 429–590 (1983).)

Furthermore, it has been reported in these several years that SOI substrate permits enhancing a speed of MOSFET and lowering its power consumption (IEEE SOI conference 1994).

Furthermore, use of an SOI structure wherein an SOI layer is disposed on a support substrate by way of an insulating layer makes it possible to shorten a time for a device processing step since an element disposed on the insulating layer can be separated in a simpler process than an element formed on a bulk silicon wafer.

That is, the SOI substrate is expected not only to enhance performance of ICs but also to lower total manufacturing cost thereof including a wafer cost and a processing cost as compared with those of MOSFET ICs.

The researches on the SOI substrate has been made vigorously since about 1970s. Researches have been made vigorously on a method which hetero-epitaxially grows single-crystal Si on a sapphire substrate which is an insulating material (SOS: Sapphire On Silicon), a method which forms the SOI structure by isolating a dielectric material by oxidation of porous silicon (FIPOS: Fully Isolation by Porous Oxidized Silicon), a bonding method and an oxygen ion implantation method.

The oxygen ion implantation method is a method which was reported first by K. Izumi and is now referred to as SIMOX (K. Izumi, M. Doken and H. Ariyoshi: Electron Lett. 14, p. 593 (1978)). This method implants oxygen ions into a silicon wafer 103 on the order of $10^{17}$ to $10^{18}$/cm$^2$ as shown in FIG. 11A (FIG. 11B) and then forms an oxide layer 105 by annealing it at a high temperature on the order of 1320° C. in an argon-oxygen atmosphere (FIG. 11C). As a result, the implanted oxygen ions couple with silicon around a depth corresponding to a projection range ($R_p$) of the implanted ions, thereby forming a silicon oxide layer to obtain an SOI substrate 107. (An SOI substrate manufactured by utilizing the SIMOX will be referred to as an "SIMOX wafer" hereinafter.)

Many reports have been made on the SOI substrate that it enhances a speed of MOSFET and lowers its power consumption (described in detail in Proceedings of 1994 IEEE International Silicon-on-Insulator Conference).

Completely depletion-mode MOSFET manufactured by utilizing the SOI substrate is expected to have faster speed and consume power at a lower rate as a driving power is enhanced.

Furthermore, the SOI structure wherein an insulating layer is disposed under an element allows the element to be separated in a simpler process than an element formed on a bulk silicon wafer, thereby shortening a time for a device processing step.

That is, the SOI structure is expected not only to enhance performance of ICs but also lower total manufacturing cost thereof including wafer costs and processing costs as compared with those of MOSFET ICs disposed on bulk silicon wafers.

A CZ wafer is generally used as a silicon substrate to manufacture an SIMOX wafer. The CZ wafer is a single-crystal silicon substrate which is manufactured by a Czochrlski method.

The CZ wafer contains grown-in defects such as COPs (Crystal Originated Particles) and FPD (Flow Pattern Defect) which are peculiar to a bulk wafer.

The COPs (H. Yamamoto, Problems Posed on Large Diameter Silicon Wafers, 23rd Ultraclean Technology College (August 1996)) and FPD (T. Abe, Extended Abst. Electrochem. Soc. Spring Meeting Vol. 95-1, pp. 596 (May, 1995)) have sizes on the order of approximately 0.1 to 0.2 μm.

The COPs and FPD will be described in detail later.

When a super LSI was manufactured with the CZ wafer, the defects such as the COPs conventionally influenced little on device characteristics since a device was manufactured with a sufficient margin for the grown-in defects.

Taking DRAMs as an example for which design rules have been changed to specify 0.5 μm for 16M-DRAM and 0.35 μm for 64M-DRAM, however, influences due to COPs are more and more remarkable on device characteristics and yields thereof.

Above all, it is said that a design rule will be modified to specify 0.1 to 0.15 μm for 1G-DRAM.

SUMMARY OF THE INVENTION

A primary object of the present invention is to provide a semiconductor substrate which is scarcely defective and a method to manufacture the semiconductor substrate.

Another object of the present invention is to provide a method to manufacture an SOI substrate having an SOI layer which contains no or a reduced number of defects such as COP, FPD and OSF peculiar to a bulk silicon wafer, and an SOI substrate comprising a buried oxide film which has an excellent quality.

According to an aspect of the present invention, there is provided a method for manufacturing a semiconductor substrate comprising the steps of:

preparing a hydrogen-annealed single-crystal silicon substrate;

forming an ion-implantation layer by implanting ions in the single-crystal silicon substrate; and forming a buried insulating film in the single-crystal silicon substrate.

According to another aspect of the present invention, there is provided the above-mentioned method for manufacturing a semiconductor substrate, wherein a protective layer is formed on the single-crystal silicon substrate after the hydrogen-annealed single-crystal silicon substrate is prepared and before the ion-implantation layer is formed, and ions are implanted from the side of the protective layer.

According to still another aspect of the present invention, there is provided the above-mentioned method for manufacturing a semiconductor substrate, comprising a step of cleaning the single-crystal silicon substrate before forming the ion-implantation layer.

According to further aspect of the present invention, there is provided the above-mentioned method for manufacturing a semiconductor substrate, wherein the single-crystal silicon substrate is heat-treated in an oxidizing atmosphere after the buried insulating film is formed.

According to further aspect of the present invention, there is provided a semiconductor substrate obtained by the method mentioned in above.

The present invention realizes a process comprised of heat-treating the Si substrate in a reducing atmosphere containing hydrogen, forming an ion-implantation layer in the layer in which COPs and so forth have been decreased or in a portion below the layer, heat-treating the resultant structure to form the buried oxidized Si layer, which makes possible to exclude or decrease the defects peculiar to bulk Si such as CZ wafer. As a result, the present invention enables the yield of the product to be improved. It is said that while a wafer having a larger diameter will be desired in future, the larger the desired diameter is, the harder the pulling up of single crystalline bulk silicon with high quality is, so that the quality of such a bulk wafer will be deteriorated. Accordingly, in the process of SIMOX wafer it will be required more and more to heat-treat the silicon substrate in the reducing atmosphere containing hydrogen before the oxygen ion implantation step in the process of SIMOX wafer.

BRIEF DESCRIPTION OF THE DRAWINGS

FIG. 7 is a flowchart descriptive of a second embodiment of the present invention;

DETAILED DESCRIPTION OF THE PREFERRED EMBODIMENTS

Figure 1:
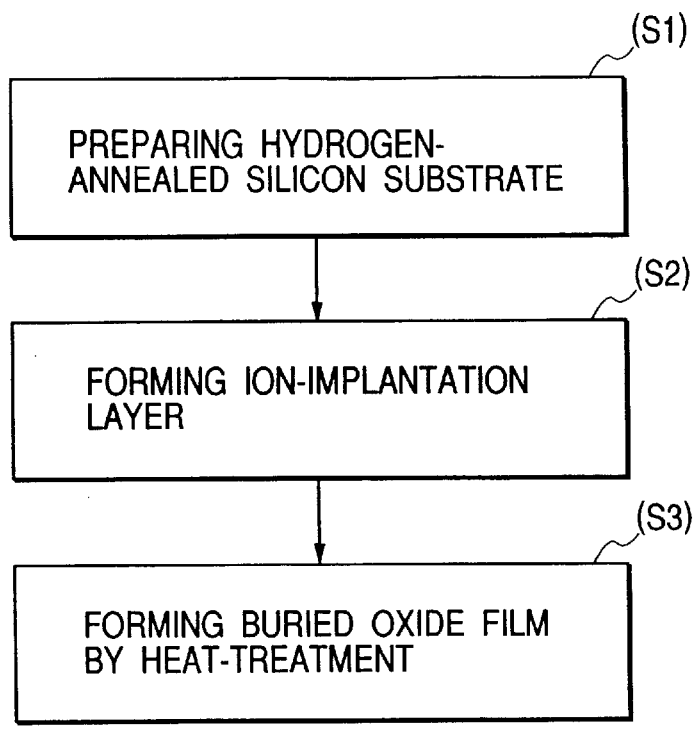
FIG. 1 is a flowchart exemplifying the method to manufacture a semiconductor substrate according to the present invention.

The present invention will be described first with reference to a flowchart shown in FIG. 1.

First, a single-crystal silicon substrate which has been heat-treated in a reducing atmosphere containing hydrogen (hereinafter referred to as "hydrogen-annealed") is prepared (S1). An ion-implantation layer is formed by implanting oxygen ions into the single-crystal silicon substrate (S2). Then, a buried oxide (BOX) layer is formed in the single-crystal silicon substrate by heat-treating the single-crystal silicon substrate in desired conditions (S3). An SIMOX wafer according to the present invention is obtained in this way.

Figure 2A:
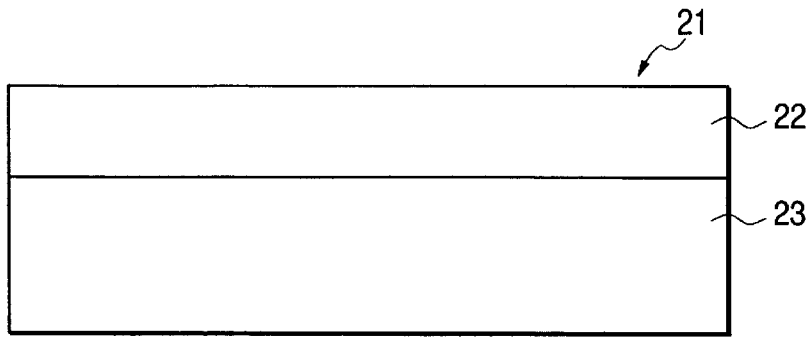
FIGS. 2A, 2B and 2C are schematic sectional views exemplifying the method to manufacture a semiconductor substrate according to the present invention.

The present invention will be described more concretely below:

A single-crystal silicon substrate 21 having a surface layer 22 which has been heat-treated in a reducing atmosphere containing hydrogen is prepared as shown in FIG. 2A. The surface layer is a less defective layer in which the grown-in defects such as COPs peculiar to a bulk wafer and defects such as OSF are remarkably reduced (the surface layer 22 may hereinafter be referred to as "less defective layer 22"). Speaking more concretely, the above-mentioned surface layer in single-crystal substrate 21 is a layer the number of COP or FPD or OSF in which is smaller than that in another portion of the same substrate. Though the surface layer 22 which has been hydrogen-annealed is clearly divided from another region 23 in FIG. 2A, a border between the surface layer 22 and the other region 23 is actually not clear. A reference numeral 63 in FIGS. 6A through 6D, a reference numeral 83 in FIGS. 8A through 8F, a reference numeral 93 in FIGS. 9A through 9E and a reference numeral 123 in FIGS. 10A through 10D also represent regions, like the region 23 shown in FIGS. 2A through 2C, which are other than surface layers formed on substrates.

Figure 2B:
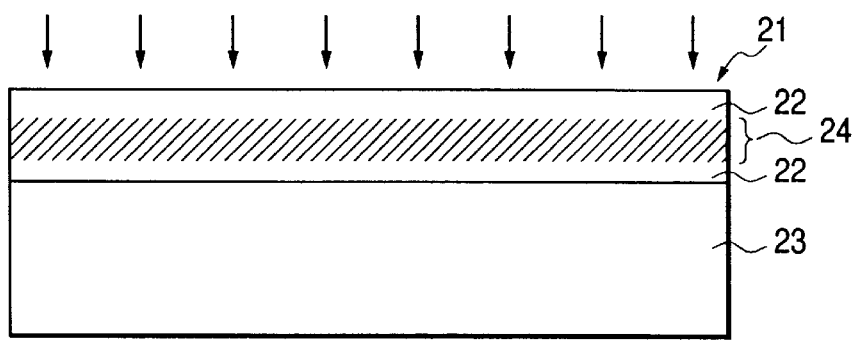

Then, an ion-implantation layer 24 is formed as shown in FIG. 2B by implanting oxygen ions.

Figure 2C:
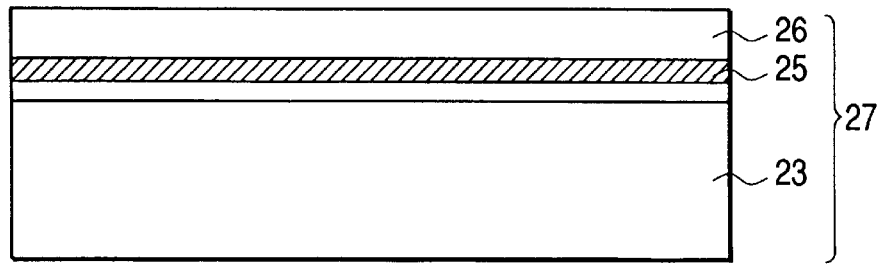

Utilizing the ion-implantation layer 24, a buried oxide film (BOX) layer 25 is formed by performing a desired heat-treatment (FIG. 2C). An SOI substrate 27 which has a single-crystal silicon layer (SOI layer) 26 on the BOX layer 25 is obtained in this way.

The present invention makes it possible to obtain a high quality SIMOX wafer which has no defects such as COPs on a surface and in an interior of the SOI layer 26 or contains such defects in a number remarkably smaller than that of defects in an ordinary bulk wafer.

The defects such as COP, FPD and OSF peculiar to the bulk wafer are inherent in a CZ wafer which is ordinarily used to manufacture an SIMOX wafer. Though causes for these defects have not been clarified yet, it has been reported that each of the defects is strongly correlated to a concentration of oxygen contained in a wafer, and the defects such as COP and OSF are liable to be produced at high oxygen concentrations (for example, in "Problems on Silicon Crystal Wafers" (Realize Co., Ltd.) p. 55).

The OSF (oxidation suspicious film defect) is produced from a fine defect which is introduced as a nucleus of crystal wafer during its growth and made visible at an oxidation step. A ring-like OSF may be observed, for example, when a wafer surface is subjected to wet oxidation.

Furthermore, the COP and FPD which are observable without a heat-treatment are considered as defects attributable to the same cause and, though both these defects are not defined strictly, it is the that the COP means an etch pit which is detectable with a fine particle detector or a foreign matter detector utilizing light scattering after wetting a wafer in SC-1 ($NH_4OH/H_2O_2$) solution which is one of element solution of an RCA cleaning solution, and that FPD means an etch pit which is observed through an optical microscope after wetting a wafer in a Secco solution ($K_2Cr_2O_7/HF/H_2O$) for about 30 minutes.

The present invention forms the SOI layer 26 itself so as to have no or a remarkably reduced number of defects such as COP since it forms the surface layer 22 in which the defects such as COP described above disappear or are reduced by annealing the surface of the silicon substrate with hydrogen and then forms the BOX layer 25 by implanting oxygen ions into the silicon substrate.

Figure 3:
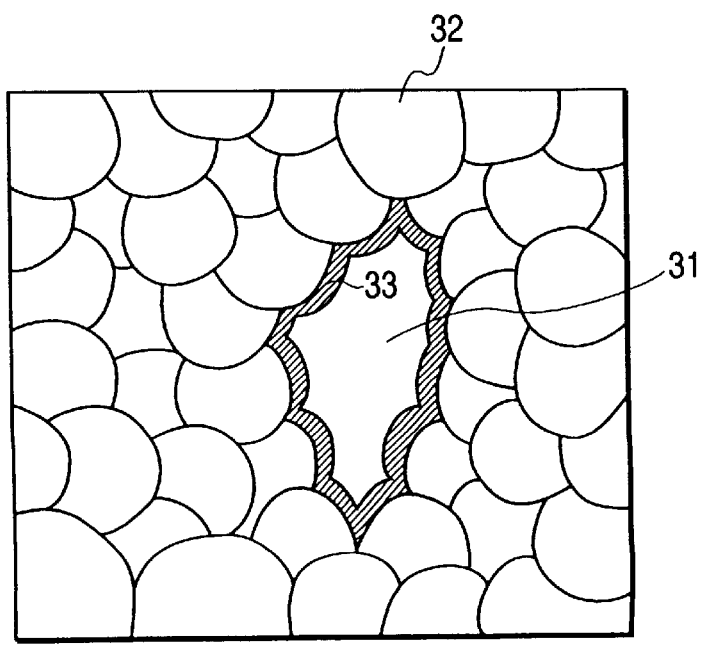
FIG. 3 is a schematic diagram descriptive of a COP contained in a silicon substrate.

A cause for the disappearance of the COP by the hydrogen-annealing will be described with reference to FIG. 3.

In the figure, reference numerals 31 and 32 represent the COP and a silicon atom which are schematically shown respectively. Reference numeral 33 represents an oxide film.

It is considered that an oxide film 33 several nanometer thick exists on an inside wall of the COP 31. When a silicon substrate is hydrogen-annealed, the oxide film 33 is removed by a reducing function of hydrogen, and a defective portion is gradually buried due to rearrangement of Si atoms and the COP 31 finally disappears (Denshi-Zairyou(Electronic Materials), June, pp. 22–26 (1998).

Figure 11A:
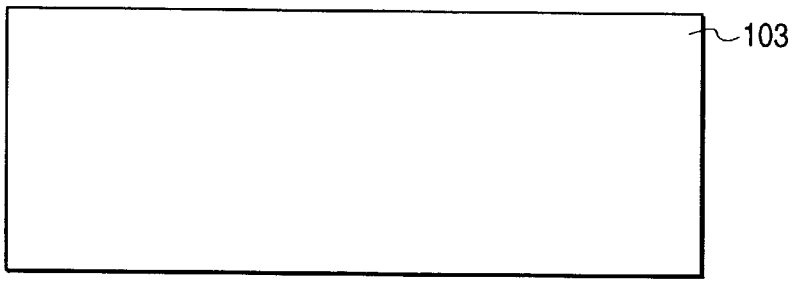
FIGS. 11A, 11B and 11C are schematic sectional views descriptive for manufacturing steps for a conventional SIMOX wafer.

It has been conventionally attempted to obtain high quality SIMOX wafers by utilizing hydrogen-annealing.
(Description will be made adequately using reference numerals shown in FIGS. 11A through 11C.)

Japanese Patent Application Laid-Open No. 10-41241 discloses a hydrogen-annealing which is effected after forming the BOX layer 105. According to this patent, a temperature for the hydrogen-annealing is within a range between 800° C. and 1000° C. which is not lower than a temperature at which oxygen between lattices of the SOI layer 106 is reduced and not higher than a temperature at which reduction does not proceed to an oxide film on an interface of the BOX layer 105.

Figure 4:
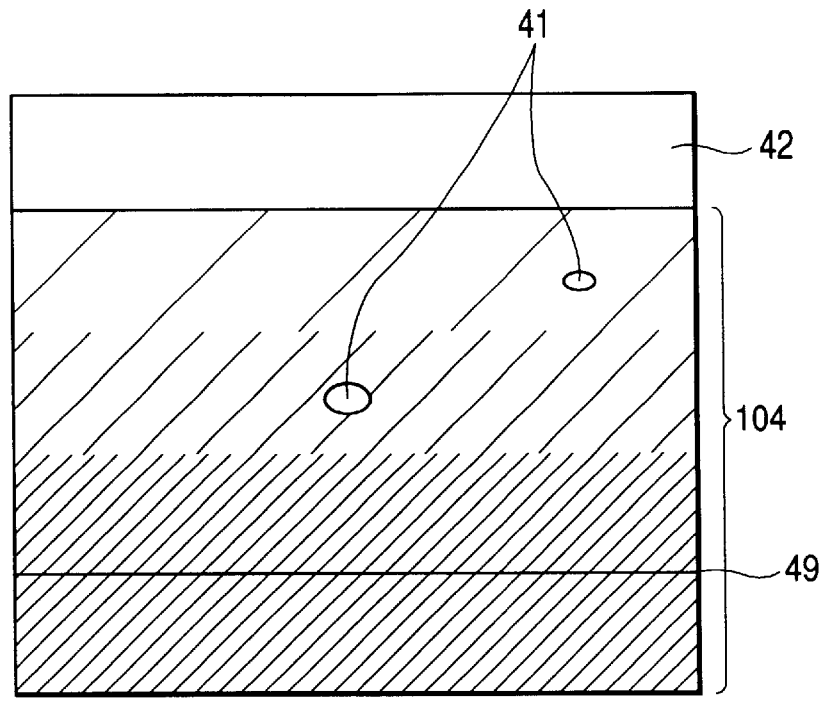
FIG. 4 is a schematic diagram descriptive of COPs contained in a silicon substrate.
Figure 11B:
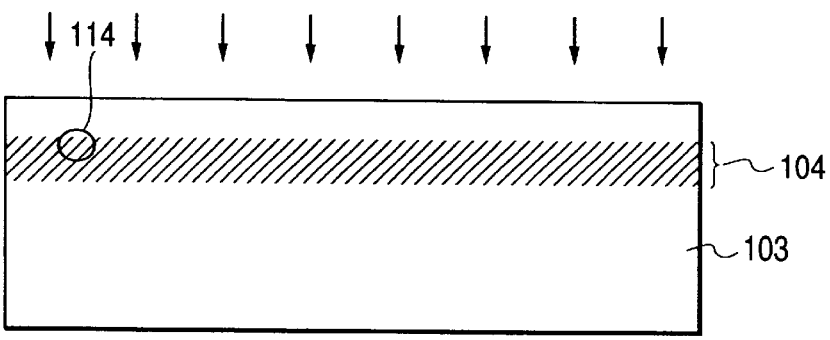
Figure 11C:
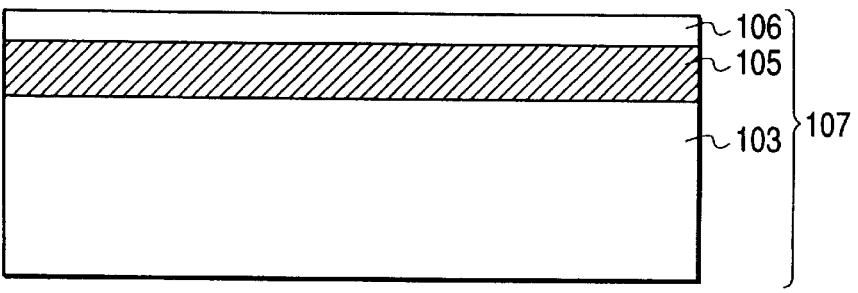

FIG. 4 is an enlarged view of a region 114 shown in FIG. 11B. In an oxygen ion-implantation layer 104 in a silicon wafer, oxygen ions are distributed within a rather broad range around a center (49 in FIG. 4) of a projection range $R_p$. When the wafer is subjected to a predetermined heat-treatment, oxygen existing in regions at which oxygen concentrations are low collected around the center 49 of the projection range $R_p$ at which oxygen concentration is high, thereby contracting the distribution smaller than that before the heat-treatment. Densities of slashes in FIG. 4 schematically represent concentrations of oxygen. FIG. 4 shows oxygen concentrations which are lowered from the center 49 of the projection range $R_p$.

Figure 5:
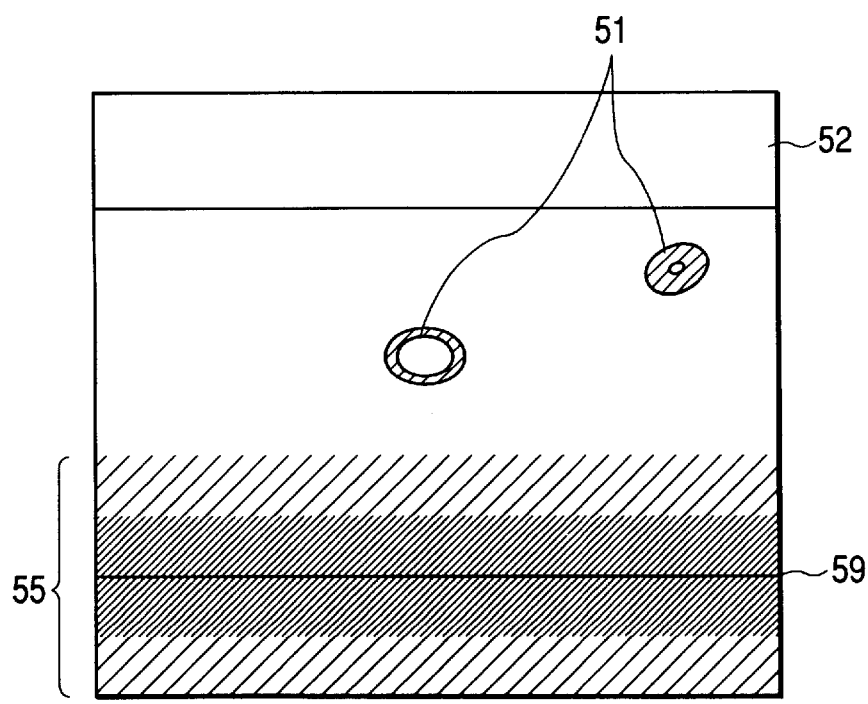
FIG. 5 is a schematic diagram descriptive of COPs contained in a silicon substrate.

When COPs 41 exist in the vicinities of the ion-implantation layer 104, however, oxygen ions are collected around not only the center 49 of the projection range $R_p$ but also the COPs 41. Accordingly, COPs 51 are grown larger than those before forming a BOX layer 55 (FIG. 5). This growth is considered due to a fact that the COPs have oxide films on their inside walls as described above and make their internal oxygen concentrations higher than those in surroundings.

After the BOX layer 55 is formed, the COPs 51 grow large in the vicinities of the BOX layer 55 in particular, thereby being hardly removable.

Furthermore, Japanese Patent Application Laid-Open No. 64-72633 and No. 8-46161 disclose a heat-treatment which is performed to form the BOX layer 105 not in an argon-oxygen mixture gas but in a hydrogen gas atmosphere after implanting oxygen ions into the silicon substrate.

Though oxygen concentrations in an oxygenion-implantation layer 104 are distributed in a pretty broad range around the projection range $R_p$, this distribution is contracted and the BOX layer 105 is formed by the heat-treatment.

Accordingly, oxygen which can contribute to the formation of the BOX layer 105 is also reduced and finally removed when the wafer is hydrogen-annealed as an attempt to vanish COPs existing in the vicinities of an interface of the BOX layer 105. In other words, oxygen to be used for forming the BOX layer is lost as the COPs disappear, whereby the BOX layer may be thin.

According to the present invention, a silicon substrate is hydrogen-annealed before oxygen ions are implanted into the silicon substrate.
(Silicon Substrate)

It is preferable to use a bulk silicon wafer, a CZ wafer in particular, as a silicon substrate and anneal the silicon substrate with hydrogen to prepare a substrate having a surface layer 22 which contains a small number of defects such as COPs.

Furthermore, not only the CZ wafer but also a silicon wafer manufactured by an MCZ method (Magnetic Field Applied Czochralski Method) (hereinafter referred to as an MCZ silicon wafer) is preferably usable as a silicon substrate to be hydrogen-annealed. It has been reported that the MCZ method is capable for manufacturing a wafer while suppressing enlargement of COPs contained in silicon more effectively than the CZ method (Denshi-Zairyou(Electronic Materials), June (1998), p. 22). By annealing the MCZ silicon wafer with hydrogen, it is possible to form a less defective layer 22 which has a quality higher than that of a less defective layer obtained by annealing the CZ wafer with hydrogen.

It is also preferable to determine specific resistance of a silicon wafer to be used considering into consideration a fact that the hydrogen-annealing causes outward diffusion of impurities such as boron or phosphorus from inside silicon.
(Step to Form Less Defective Layer by Hydrogen-annealing)

When a CZ silicon wafer which ordinarily contains oxygen on the order of $10^{18}$ atoms/cm$^3$ is hydrogen-annealed, oxygen is diffused outward from inside the wafer, whereby oxygen concentrations are lowered on a surface of the wafer and in the vicinities thereof.

The lowering of the oxygen concentrations improves a quality of a surface layer of the wafer, thereby permitting forming a surface layer 22 which has a smaller number of defects such as COPs and OSFs (the surface layer may hereafter be referred to as "less defective layer").

Speaking of the COPs, the CZ silicon wafer contains COPs at a density of $10^5$ to $10^7$/cm$^3$ and an 8-inch CZ wafer, for example contains COPs in a number of 400 to 500 COPs per unit wafer in the vicinity of its surface. When the CZ silicon wafer is hydrogen-annealed, however, the number of COPs is remarkably reduced to 10 or so in the vicinity of the surface. That is, a substantially defectless layer (DZ layer; Denuded Zone) is formed. The expression "the number per unit wafer" means herein the number of COPs or the like per area to be occupied by a wafer. In case of the 8-inch wafer, the number per unit wafer is the number of COPs in an area of about 324 cm$^2$.

Taking required thickness of the SOI layer into consideration, it is preferable to form the less defective layer 22 formed by the hydrogen-annealing so as to have thickness on the order of 500 to 5000 mm.

An oxygen concentration in the less defective layer 22 is not higher than $1\times10^{18}$ atoms/cm$^3$, preferably not higher than $5\times10^{17}$ atoms/cm$^3$, more preferably not higher than $1\times10^{17}$ atoms/cm$^3$.

It is desirable that a COP density per unit volume in the less defective layer 22 is not lower than 0/cm$^3$ and not higher than $5\times10^6$/cm$^3$, preferably not lower than 0/cm$^3$ and not higher than $1\times10^6$/cm$^3$, more preferably not lower than 0/cm$^3$ and not higher than $1\times10^5$/cm$^3$. It is desirable in particular that a COP density in a depth region from an outermost surface of the surface layer 22 to a projection range of the implanted ions is within the range specified above.

Furthermore, it is desirable for the 8-inch wafer that the number of COPs per unit wafer in the less defective layer 22 is not smaller than 0 and not larger than 500, preferably not smaller than 0 and not larger than 100, more preferably not smaller than 0 and not larger than 50, further more preferably not smaller than 0 and not larger than 10. It is desirable in particular that the number of COPs per unit wafer on the surface of the wafer is within the range not smaller than 0 and not larger than 100 specified above. Since COPs are distributed on a surface of a wafer under a strong tendency to be concentrated within a range about 6 cm around a center of the wafer, it is desirable that a 12-inch wafer or a larger wafer has the number of COPs per unit area which is on the order of that for the 8-inch wafer. The expression "the number per unit wafer" means "the number per wafer area" and in case of the 8-inch wafer, for example, it is the number of COPs per about 324 cm$^2$.

Furthermore, it is desirable that the number per unit area of a wafer surface is not smaller than 0/cm$^2$ and not larger than 1.6/cm$^2$, preferably not smaller than 0/cm$^2$ and not larger than 0.5/cm$^2$, and more preferably not smaller than 0/cm$^2$ and not larger than 0.05/cm$^2$.

The number of FPDs per unit area of the less defective layer 22 is not smaller than 0/cm$^2$ and not larger than $5\times10^2$/cm$^2$, more preferably not smaller than 0/cm$^2$ and not larger than $1\times10^2$/cm$^2$.

When the less defective layer 22 is defined by OSFs, it is desirable that a density of OSFs per unit area is not lower than 0/cm$^2$ and not higher than 100/cm$^2$, preferably not lower than 0/cm$^2$ and not higher than 50/cm$^2$, more preferably not lower than 0/cm$^2$ and not higher than 10/cm$^2$.

The reducing atmosphere containing hydrogen which is to be used for heat-treatment to form the less defective layer 22 may be composed of a 100% gas of hydrogen, a mixture gas of hydrogen and rare gas (such as Ar, He, Ne, Xe or Kr) or a mixture gas of hydrogen and nitrogen.

It is desirable to perform the hydrogen-annealing at a temperature which is not lower than 500° C. and not higher than a melting point of the silicon substrate, preferably not lower than 800° C. and not higher than the melting point of the silicon substrate, more preferably not lower than 1000° C. and not higher than the melting point of the silicon substrate. In particular, the hydrogen-annealing at a temperature of higher than 1000° C. and less than the melting point of the silicon brings about a large advantageous effect of decreasing steeply COPs and so forth. The melting point of silicon is approximately 1412° C.

Taking a diffusion speed and a burden of oxygen to be imposed on a heat-treatment furnace, it is preferable to set the annealing temperature at a level which is not lower than 800° C. and not higher than 1350° C. More preferably, the annealing temperature is higher than 1000° C. and not higher than 1350° C.

Though a pressure of the atmosphere containing hydrogen for the hydrogen-annealing may be at an atmospheric level, a reduced level or an enhanced level, it is preferable that atmosphere is kept at the atmospheric level ($1\times10^5$ Pa) or a level which is not higher than the atmospheric level and not lower than $1\times10^4$ Pa. It is also preferable to perform the hydrogen-annealing at a lightly reduced level of the atmospheric pressure −100 mm H$_2$O. Defects such as the COPs caused by outward diffusion of oxygen can be reduced effectively by performing the hydrogen-annealing at a reduced pressure though the effect is dependent on a structure of a furnace used for the heat-treatment.

An ordinary vertical type heat-treatment furnace or a horizontal type heat-treatment furnace may be used for the hydrogen-annealing. The furnace may use an electrical resistance heater, a high-frequency heater or the like.

The hydrogen-annealing may be carried out by utilizing radiation from a lamp which is used for RTA (Rapid Thermal Annealing). In this case, an infrared light annealing apparatus using a halogen lamp or an arc lamp, a flash lamp annealing apparatus using a xenon flash lamp or the like may be used as a rapid annealing apparatus. A lamp used for heating in particular makes it possible to carry out the hydrogen-annealing in a short time.

The hydrogen-annealing can be carried out for several seconds to tens of hours, preferably several seconds to several hours.

(Step to Implant Oxygen Ions)

Prior to the step to implant oxygen ions into the silicon substrate 21 having the surface layer 22 which is the less defective layer, it is preferable to form a silicon oxide layer on the silicon substrate 21 by oxidizing a surface of the surface layer 22 so that oxygen ions are implanted from the side of the silicon oxide layer. Thermal oxidizing such as the following concrete means is employed as the above-mentioned oxidizing:

so-called dry O$_2$ oxidization in which oxygen gas with a carrier gas of nitrogen is flowed, so-called wet O$_2$ oxidization in which oxygen gas is supplied by means of hot water, so-called steam oxidization using 100% of steam or steam with nitrogen gas, so-called pyrogenic oxidization in which hydrogen gas and oxygen gas are subjected to combustion to water vapor and then the vapor is supplied, so-called O$_2$ partial pressure oxidization in which oxygen gas prepared by making nitrogen gas as a carrier pass through liquid oxygen is flowed, and so-called hydrochloric acid oxidization in which hydrochloric acid gas is added with nitrogen gas and oxygen gas. The silicon oxide layer functions as a protective layer which prevents the surface of the silicon substrate from being roughened by implanting ions. In place of the silicon oxide layer, silicon nitrogen layer may be formed by nitriding the surface layer 22.

Needless to say, a protective layer may be formed by depositing a silicon oxide film or a silicon nitrogen film on the surface layer 22 by a CVD method such as a heat CVD method or a plasma CVD method.

It is preferable that the protective layer has thickness of several nanometers to several micrometers.

Though the ion-implantation layer 24 is located inside the less defective layer 22 in FIGS. 2A through 2C, the ion-implantation layer 24 may be located inside or outside the surface layer 22 or on an interface between the surface layer 22 and the region 23 so far as a single-crystal silicon layer functioning as the SOI layer 26 is a less defective layer. In FIG. 2A, the region 23 occupies all portions of the silicon substrate which are other than a region (a surface layer 22) which is made into a less defective layer by the hydrogen-annealing. It is desirable to implant ions so that the projection range $R_p$ (implantation depth) of the ions is located inside the surface layer 22 shown in FIG. 2A.

It is needless to say that an entire range, an upper surface or a bottom surface of the silicon substrate is formed as the less defective layer 22.

An ion-implantation layer 124 may be formed, for example, as shown in FIGS. 10A through 10D. An embodiment of the present invention will be exemplified briefly with reference to FIGS. 10A through 10D.

Figure 10A:
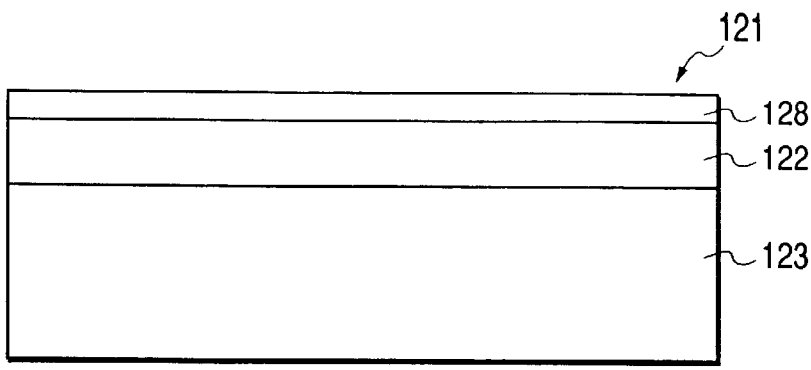
FIGS. 10A, 10B, 10C and 10D are schematic sectional views descriptive of another example of the first embodiment of the present invention.

First, a substrate 121 composed of a single-crystal Si wafer is prepared as an Si substrate and at least a main surface of the substrate is heat-treated in an atmosphere containing hydrogen, thereby forming a surface layer 122 which has a reduced number of defects due to bulk. Though the surface layer 122 is traced as if it is clearly separated from the rest portion of the substrate 121 with a border, the surface layer 122 gradually changes actually. Furthermore, an insulating layer 128 functioning as a protective layer may be formed on the surface layer 122 as occasion demands (FIG. 10A).

Figure 10B:
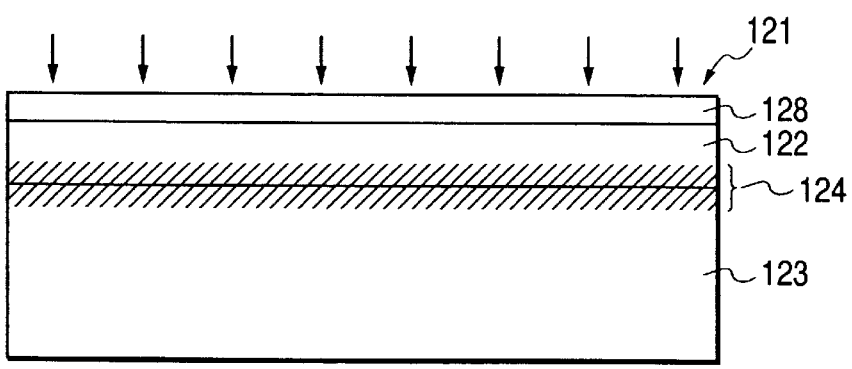

Then, oxygen ions are implanted from the side of the main surface, i.e., the surface layer 122, of the substrate 121. The ion-implantation layer 124 is formed in the vicinity of an interface between a low region 123 of the substrate 121 and the surface layer 128 or inside the surface layer 122. Preferably, an implantation energy and an implanting rate are adjusted so that interface between the heat-treated surface layer 122 and the low region 123 is included in a silicon oxide layer when the ion-implantation layer 124 becomes a silicon oxide layer after a heat-treatment and ions are implanted in the adjusted conditions of the implantation energy and implanting rate (FIG. 10B).

Figure 10C:
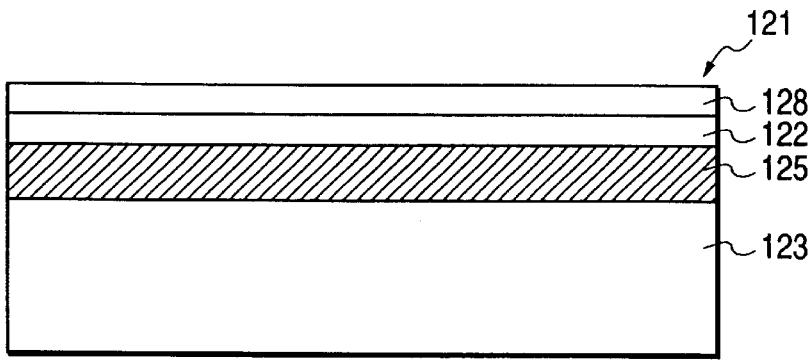

Then, the substrate 121 is heat-treated as shown in FIG. 10C.

A silicon oxide layer (buried silicon oxide layer) 125 is thus formed under the single-crystal silicon layer 122 which is located on a side of the main surface of the substrate 121.

Since the single-crystal silicon layer 122 remaining on the silicon oxide layer 125 has been heat-treated in the reducing atmosphere containing hydrogen as described above, production of FPDs and COPs is suppressed in the silicon oxide layer 125.

Figure 10D:
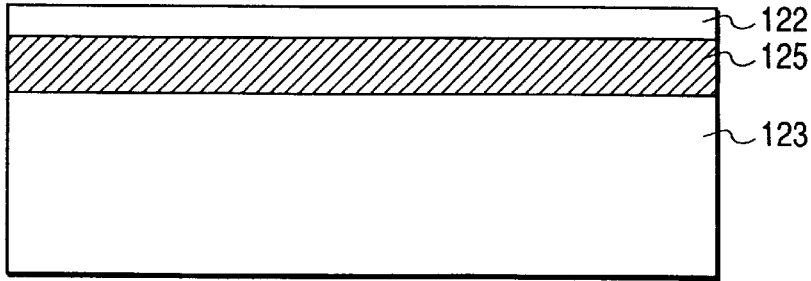

By removing the oxide film 128 from the surface layer 122, a semiconductor substrate (SIMOX wafer) is obtained as shown in FIG. 10D. Needless to say, the surface oxide film 128 may not be removed till a stage immediately before a device processing step in order to prevent the surface from being contaminated. The single-crystal silicon layer 122 thus obtained is flattened and uniformly thinned by way of the silicon oxide layer 125, thereby being formed so as to have a large area over the entire range of the wafer. The semiconductor substrate thus obtained is usable preferably to manufacture an insulated electronic element.

After the surface oxide film 128 is removed, the semiconductor substrate may be heat-treated once again in a reducing atmosphere containing hydrogen as occasion demands. Surface roughness is smoothed by these heat-treatments. The heat-treatment produces no slight scratches on the surface since it can smooth the surface without touch polishing which has a mechanical polishing function stronger than a chemical etching function.

Though oxygen ions can be implanted at an accelerating voltage within a range from 1 keV to 10 MeV, thickness of an ion-implantation layer changes dependently on levels of accelerating voltages and it is preferable to select an accelerating voltage on the order of several tens keV to 500 keV.

An implantation radiation dose is $1.0 \times 10^{16}/cm^2$ to $1.0 \times 10^{19}/cm^2$, more preferably within a range from $5.0 \times 10^{16}/cm^2$ to $5.0 \times 10^{18}/cm^2$.

It is desired that oxygen ions are implanted at a temperature within a range from $-200°$ C. to $700°$ C., preferably within a range from $0°$ C. to $700°$ C., more preferably within a range from a room temperature to $700°$ C. In particular, it is preferable that a temperature of the substrate during the ion-implantation is $550°$ C. through $650°$ C. so as to obtain a suitable buried oxide film with small electric current leak.

To implant oxygen ions into a silicon substrate, it is ordinary to select only oxygen ions ($O^+$) out of various kinds of ions emitted from an ion source with a mass separating apparatus, accelerate the selected $O^+$ ions at a desired accelerating voltage and implant the ions into a silicon substrate with an ion beam obtained by the acceleration. To implant the ions into an entire surface of the substrate, ions are implanted while scanning the silicon substrate with the ion beam. Needless to say, this method is not limitative of the present invention.

On the other hand, it is preferable to implant oxygen ions by plasma doping (plasma immersion ion implantation) (Jingbao Liu et al., Appl. Phys. Lett. 67, 2361 (1995)).

This method is configured not to project an ion beam but to irradiate a large area at a time, thereby permitting to shorten a time required for implanting oxygen ions but reducing a manufacturing cost of a semiconductor substrate.

Furthermore, this method is capable of implanting nitrogen ions in place of oxygen ions when a silicon nitride layer is required in place of a silicon oxide layer as an insulating layer for an SOI substrate.

Furthermore, it is possible to implant ions at a plurality of steps while changing an implantation radiation dose and/or an implantation energy (an accelerating voltage). When an implantation energy is to be changed, it is preferably to select an implantation energy level for a second step which is lower than that at a first step. When ions are to be implanted at a plurality of steps, it is possible to select different kinds of ions to be implanted into a silicon substrate at different steps. When ions are to be implanted at two steps, it is preferable to implant a first kind of ions and then a second kind of ions which are lighter than the first kind of ions. For example, oxygen ions and hydrogen ions are to be selected as the first and second kinds respectively.

When a protective layer is not formed on an uppermost surface of a silicon substrate before forming the ion-implantation layer, it is also preferable to form a protective layer on a surface of a silicon substrate after an ion-implantation layer is formed. In such a case, the protective layer is capable of preventing the surface of the substrate from being roughened by a high temperature heat-treatment at a stage to form the BOX layer.

(Heat-treatment Step to Form BOX Layer)

A heat-treatment atmosphere to form the BOX layer which is the buried oxide film is an atmosphere consisting mainly of a gas selected from among oxygen, nitrogen, Ar, He, Ne and Xe, more preferably a gas atmosphere prepared by diluting oxygen with an inert gas (for example, a mixture gas atmosphere of argon and oxygen).

Furthermore, the BOX layer can be formed by heat-treatment in a reducing atmosphere containing hydrogen.

A heat-treatment temperature to form the BOX layer is a temperature which is not lower than 600° C. and not higher than a melting point of silicon, preferably not lower than 800° C. and not higher than the melting point of silicon, more preferably not lower than 1000° C. and not higher than 1400° C. When the BOX layer is to be formed in a reducing atmosphere containing hydrogen, it is preferable to select a temperature which is not lower than 800° C. and not higher than 1000° C.

A heat-treatment time to form the BOX layer is not shorter than 0.5 hour and not longer than 20 hours, preferably not shorter than 2 hours and not longer than 10 hours. Though a heat-treatment time as short as possible is preferable to lower a manufacturing cost, it is desired to specify a heat-treatment time so as to form a uniform and continuous BOX layer.

The BOX layer can be formed under an atmospheric pressure, a reduced pressure or an enhanced pressure.

An SOI substrate is obtained by forming the BOX layer and when the SOI layer 26 has a rough surface, it is preferable to smooth the surface of the SOI layer after removing the surface oxide film.

Speaking concretely, the surface of the SOI layer is smoothed by chemical-mechanical polishing (CMP) or hydrogen-annealing. Usable as abrasive materials for the CMP are polishing grains of a borosilicate glass, titanium dioxide, titanium nitride, aluminium oxide, iron nitrate, cerium oxide, colloidal silica, silicon nitride, silicon carbide, graphite and diamond or abrasive grain liquid consisting of these polishing grains and an oxidizing agent such as $H_2O_2$ or $KIO_3$ and an alkaline solution such as NaOH or KOH.

The surface of the SOI layer can be smoothed by hydrogen-annealing in an atmosphere consisting a 100% gas of hydrogen or a mixture gas of hydrogen and a rare gas (Ar, Ne or the like). The hydrogen-annealing allows boron and phosphorus to be diffused out of the SOI layer, thereby enhancing resistance of the SOI layer.

A temperature for the hydrogen-annealing is not lower than 800° C. and not higher than melting point of silicon, preferably not lower than 800° C. and not higher than 1350° C., more preferably not lower than 850° C. and not higher than 1250° C.

Though the atmosphere containing hydrogen for the hydrogen-annealing may be kept at an atmospheric pressure or a reduced pressure, it is preferable to carry out the annealing at an atmospheric pressure ($1 \times 10^5$ Pa) or a pressure which is lower than the atmospheric pressure and not lower than $1 \times 10^4$ Pa. A slightly reduced pressure on the order of the atmospheric pressure −100 mm $H_2O$ is more preferable for the hydrogen-annealing.

When a protective layer is formed on the surface layer 22, the protective layer is removed as occasion demands after the BOX layer 25 is formed. The protective layer is removed by polishing, grinding, CMP, dry etching or wet etching (usable as an etchant is fluoro-nitride series, enthylenediamine series, KOH series or hydrazine series etchant. Furthermore, usable as an etchant is hydrofluoric acid, a mixture liquid of hydrofluoric acid to which at least either of hydrogen peroxide and alcohol is added or a mixture liquid of buffered hydrofluoric acid to which at least either of hydrogen peroxide and alcohol is added).

The present invention makes it possible to enhance a yield of devices by reducing or vanishing COPs in SOI layers. Under the present circumstances where it is the that wafers which have larger diameters hereafter will make it more difficult to enhance qualities of crystals, it is considered that qualities of bulk wafers are to be lowered.

Accordingly, it will be more necessary to anneal silicon substrates with hydrogen before implanting oxygen ions.

Now, the preferred embodiments of the present invention will be described.

Embodiment 1

A first embodiment of the present invention will be described with reference to FIGS. 6A through 6D.

Figure 6A:
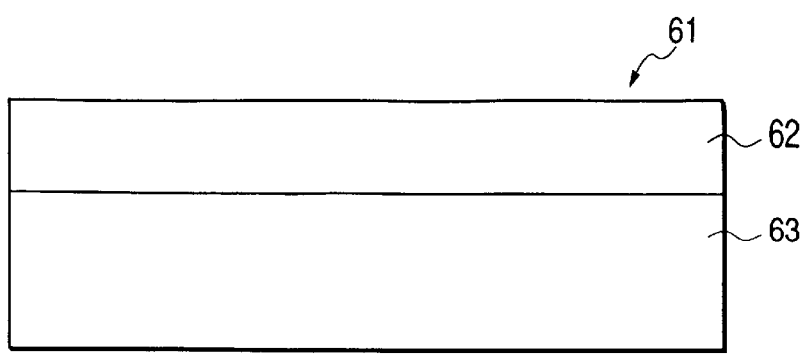
FIGS. 6A, 6B, 6C and 6D are schematic sectional views descriptive of a first embodiment of the present invention.
Figure 6B:
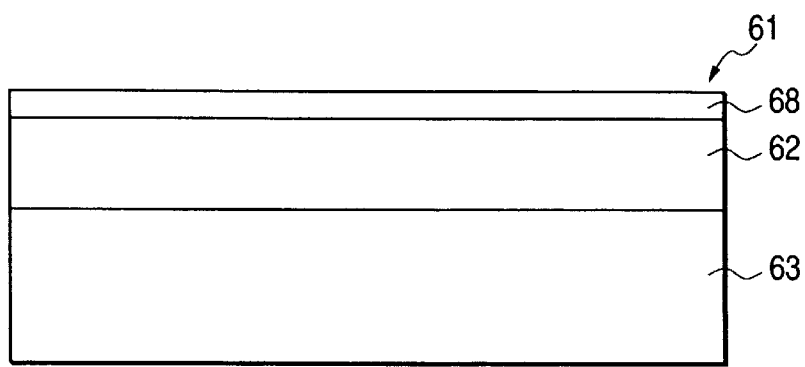

First, a silicon substrate 61 is prepared and at least a main surface of the substrate is heat-treated in a reducing atmosphere containing hydrogen. The hydrogen-annealing forms a surface layer 62 which is a less defective layer which is free from defects such as COPs or has a remarkably small number of such defects (FIG. 6A).

Then, a protective layer 68 is formed on the surface layer 62. The protective layer 68 is, for example, a silicon oxide layer which is obtained by thermally oxidizing a surface of the surface layer 62. Needless to say, the protective layer 68 may be formed as occasion demands and omitted.

Figure 6C:
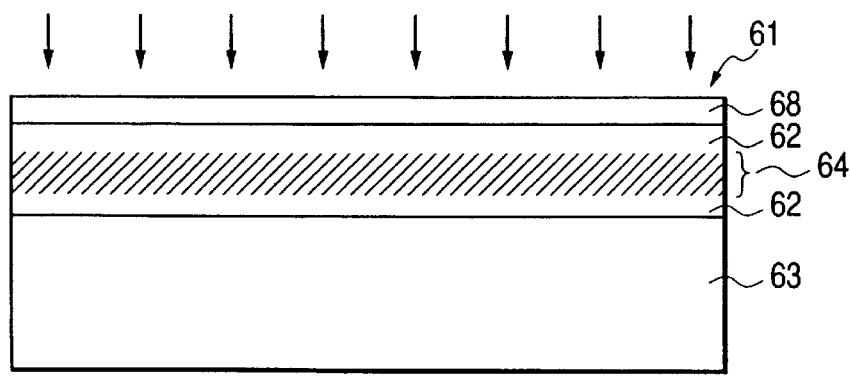

An ion-implantation layer 64 is formed by implanting oxygen ions from the side of the main surface of the silicon substrate 61, i.e., from the side of the surface layer 62 (FIG. 6C). After adjusting an accelerating voltage and an implantation radiation dose, the ion implantation is performed so as to obtain a desired buried oxide film (BOX) layer.

Figure 6D:
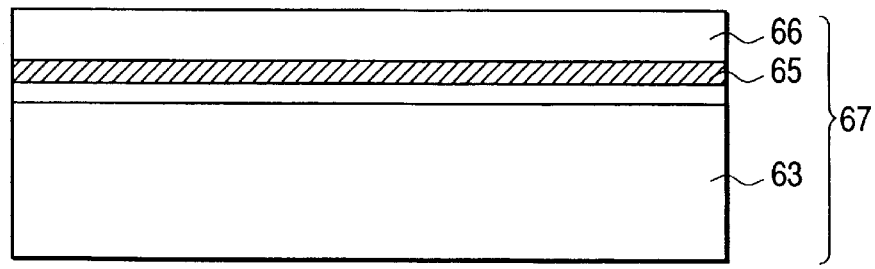

By heat-treating the silicon substrate 61, the ion-implantation layer 64 is changed into a BOX layer 65 as shown in FIG. 6D. Subsequently, an SOI layer 66 which contains no defects such as the COPs (or contains the defects in a remarkably small number) can be obtained by removing the protective layer 68. Needless to say, the protective layer 68 may not be removed till a step immediately before processing a device to prevent contamination on the surface.

When a surface of the SOI layer 66 is rough to an unallowable degree, it is smoothed by CMP or hydrogen-annealing.

An SIMOX wafer 67 is completed in this way. This wafer is preferably usable to manufacture an insulated electronic element.

Embodiment 2

A second embodiment of the present invention will be described first with reference to a flowchart shown in FIG. 7.

A single-crystal silicon substrate which has been hydrogen-annealed is prepared (S1). After forming a surface protective film on the single-crystal silicon substrate, an ion-implantation layer is formed by implanting oxygen ions into the single-crystal silicon substrate (S2). Then, a BOX layer is formed in the single-crystal silicon substrate by heat-treating the single-crystal silicon substrate in desired conditions (S3). These steps are similar to those in the flowchart shown in FIG. 1. At the step (S2), the formation of the protective film may be omitted as occasion demands.

In this embodiment, the silicon substrate is cleaned (S4) after the BOX layer is formed in order to form an ion-implantation layer once again (S5). Then, a heat-treatment is carried out as at (S3) to form a BOX layer (S6). An SIMOX wafer is completed in this way (S7). When particles exist on a surface of a substrate, the particles function as masks and the ion-implantation layer may not be formed at some regions. This embodiment is capable of preventing oxygen ions from being implanted ununiformly since it is configured to clean the surface of the silicon substrate after forming the BOX layer and then implant ions once again.

Though two ion implantation steps are shown in FIG. 7, the ion implantation step may be repeated at any times as occasion demands. Furthermore, it is preferable to clean the silicon substrate after the step (S1) and before the step (S2).

Furthermore, the heat-treatment to form the BOX layer may be carried out at a single step after completing the final ion implantation step.

This embodiment will be described with reference to FIGS. 8A through 8F.

Figure 8A:
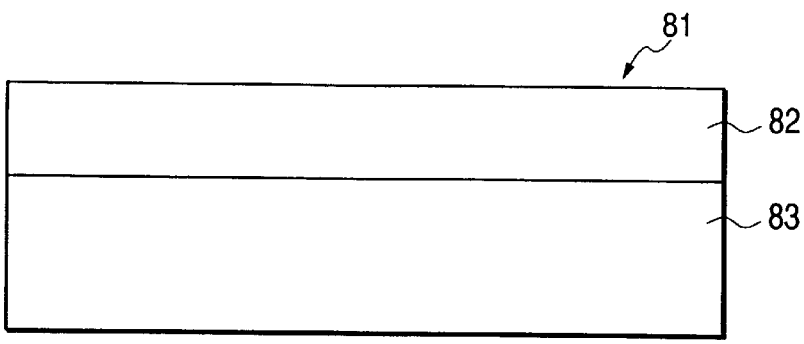
FIGS. 8A, 8B, 8C, 8D, 8E and 8F are schematic sectional views descriptive of the second embodiment of the present invention.
Figure 8B:
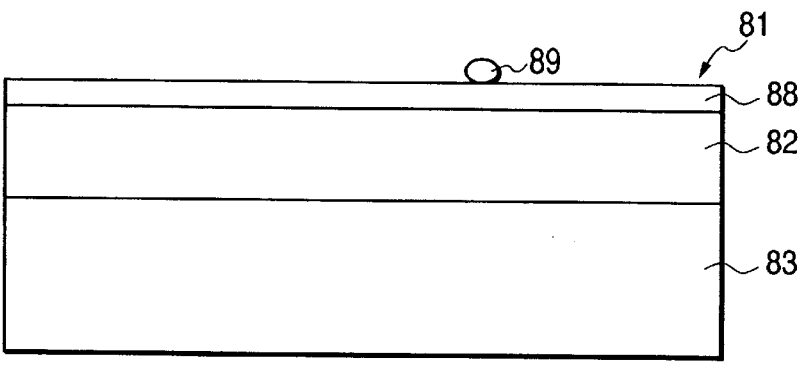

A silicon substrate 81 hydrogen-annealed and having a surface layer 82 containing a remarkably small number of defects such as COPs is prepared (FIG. 8A). A protective layer 88 is formed on the surface layer 82 (FIG. 8B). A reference numeral 89 represents a particle adhering to the silicon substrate. The protective layer 88 is preferable to prevent a surface from being roughened by implanting ions but may not be formed as occasion demands.

Figure 8C:
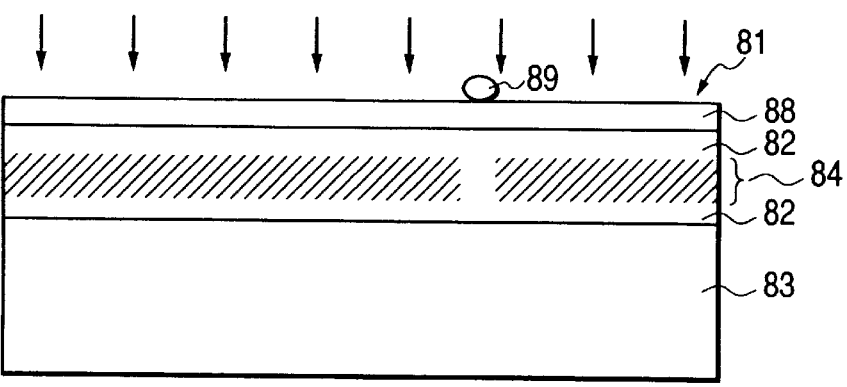

An ion-implantation layer 84 is formed as shown in FIG. 8C. The particle 89 functions as a mask, thereby producing a region in which the ion-implantation layer is not formed. Though the ion-implantation layer 84 is formed in the surface layer 82 in FIG. 8C, this location is not limitative needless to say.

Figure 8D:
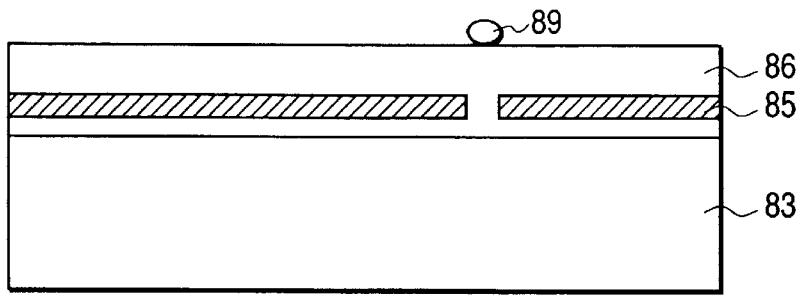
Figure 8E:
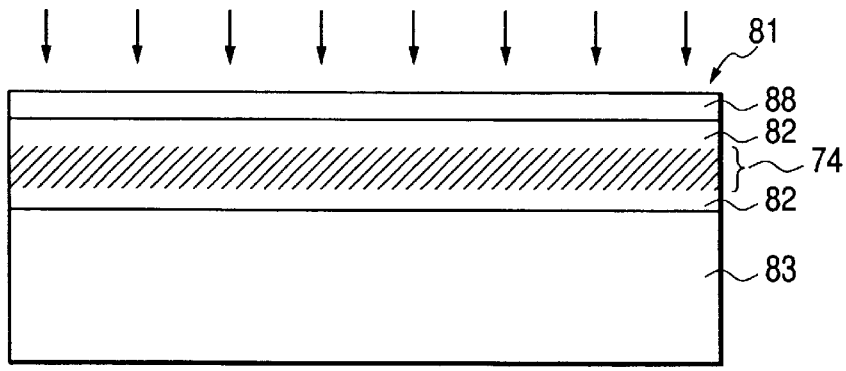

Though a buried oxide film (BOX) layer 85 is formed subsequently by carrying out a predetermined heat-treatment, the BOX layer is also made discontinuous under an influence due to the particle 89 (FIG. 8D).

Then, the silicon substrate 81 is cleaned to remove the particle 89 (not shown). After cleaning, an ion-implantation layer 74 is formed once again (FIG. 8E) and a BOX layer 75 is formed by carrying out a desired heat-treatment.

Figure 8F:
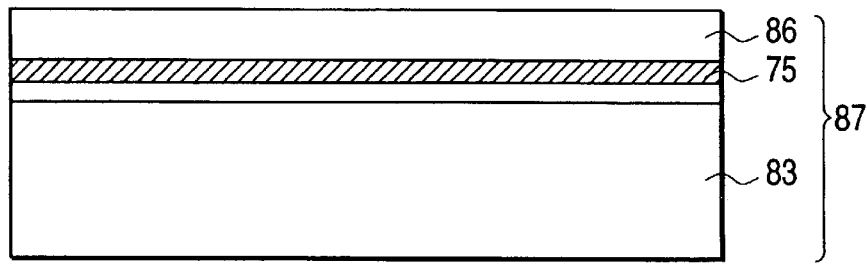

An SIMOX wafer 87 which has a remarkably smooth SOI layer is completed by heat-treating a surface of an SOI layer 86 in a reducing atmosphere containing hydrogen after removing the surface protective layer 88 (FIG. 8F).

Usable as a chemical to clean the silicon substrate is DHF (mixture solution of HF and $H_2O$), APM (mixture solution containing $NH_4OH$ and $H_2O_2$), HPM (mixture solution containing HCl and $H_2O_2$), SPM (mixture solution containing $H_2SO_4$ and $H_2O_2$), FPM (mixture solution containing HF and $H_2O_2$), BHF (mixture solution of $NH_4F$, Hf and $H_2O$) or the like.

Embodiment 3

FIGS. 9A through 9E are schematic sectional views illustrating a third embodiment of the present invention.

Figure 9A:
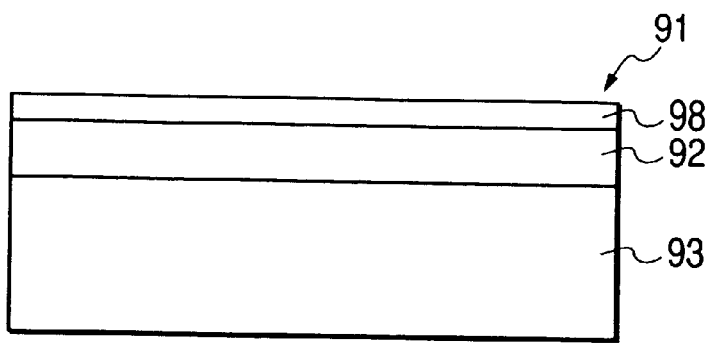
FIGS. 9A, 9B, 9C, 9D and 9E are schematic sectional views descriptive of a third embodiment of the present invention.
Figure 9B:
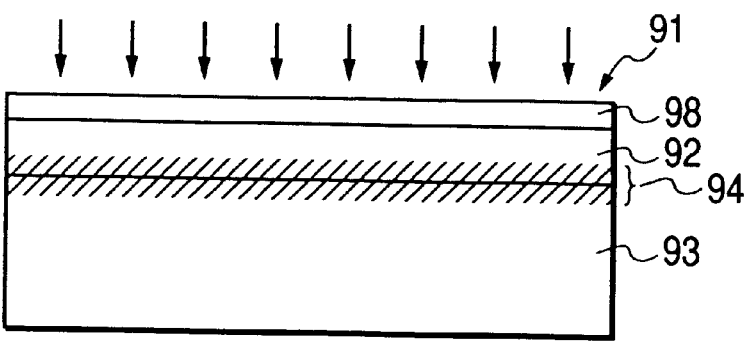

A silicon substrate 91 having a surface layer 92 which has been hydrogen-annealed and a protective layer 98 which is formed on the surface layer 92 is prepared (FIG. 9A). The protective layer 98 may be omitted as occasion demands. An ion-implantation layer 94 is formed by implanting oxygen ions from the side of the surface layer 98 as shown in FIG. 9B.

Figure 9C:
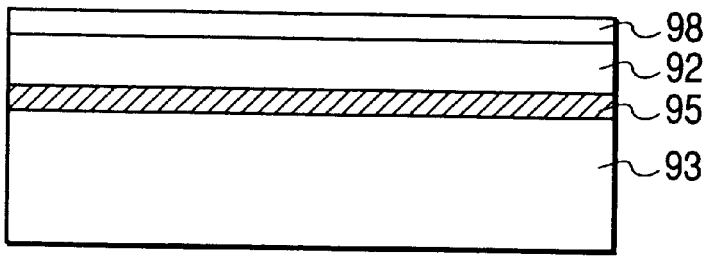

Subsequently, a BOX layer 95 is formed by carrying out a desired heat-treatment (FIG. 9C). In case of forming the BOX layer in a non-oxidizing atmosphere, it is also preferable to add previously to the non-oxidizing atmosphere 1% or fewer of oxygen.

Then, the protective layer 98 is removed as occasion demands and then the silicon substrate 91 is subjected to a high temperature heat-treatment, i.e., an ITOX treatment (Internal Thermal Oxidation) in an oxidizing atmosphere.

Figure 9D:
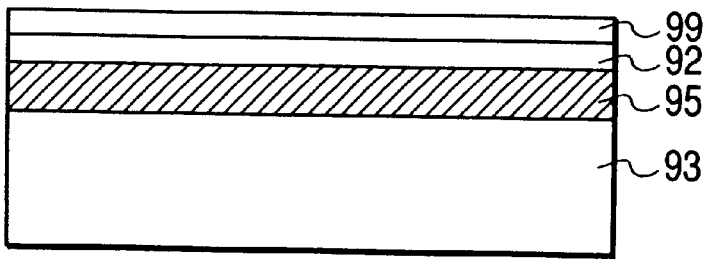

The ITOX treatment not only forms a surface oxide film 99 once again on a surface of the SOI layer 92 but also thickens the internal BOX layer 95, thereby enhancing a reliability of the BOX layer (FIG. 9D). The removal of the protective layer 98 which is conducted prior to the ITOX treatment may be omitted.

When the protective layer 98 is not formed prior to the formation of the ion-implantation layer 94, a protective layer may be formed after the ion-implantation layer 94 is formed.

Speaking concretely, it is desirable to compose the oxidizing atmosphere of oxygen and an inert gas (Ar, Ne or the like).

To restrict a speed to form a surface oxide film and promote to thicken an internal oxide film, it is desirable to lower an oxygen concentration on the atmosphere and enhance a heat-treatment temperature.

For the ITOX treatment, it is preferable to use an atmosphere containing oxygen, concretely an atmosphere consisting of oxygen and an inert gas (Ar, Ne or the like). Furthermore, the ITOX treatment can be carried out in an atmosphere kept at an atmospheric level, a reduced pressure or an enhanced pressure. An oxygen concentration in the atmosphere may be within a range from 1% to 100%.

It is preferable to carry out the ITOX treatment at a temperature within a range from 1000° C. to a level not higher than the melting point of silicon, preferably within a range from 1150° C. to a level not higher than the melting point of silicon. In particular, in case of improving the quality of the buried oxide film, it is preferable to carry out the treatment at a temperature not less than 1200° C., more preferably within a range between not less than 1300° C. and not more than melting point of silicon.

Figure 9E:
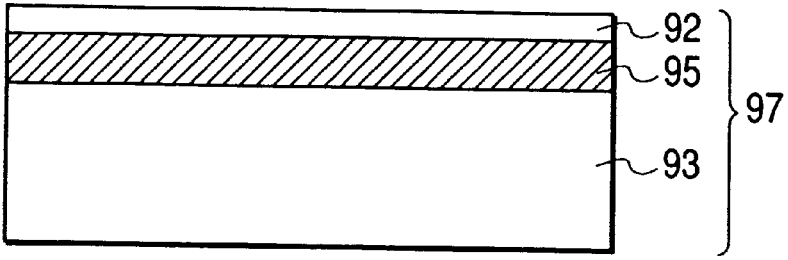

By removing the surface oxide film 99 as occasion demands, it is possible to obtain an SIMOX wafer 97 which has a remarkably small number of defects such as COPs on a surface of an SOI layer and a BOX layer having a high reliability (FIG. 9E). To prevent the surface from being contaminated, the protective layer 99 may not be removed till a step just before processing a device.

Flatness of the SOI layer 92 can be enhanced by heat-treating it in a reducing atmosphere containing hydrogen after removing the surface oxide film 99.

EXAMPLE 1

Two 8-inch single-crystal silicon substrates (CZ wafers) which were manufactured by the CZ method were prepared as silicon substrates. One of the substrates was heat-treated in a reducing atmosphere containing hydrogen. Treatment conditions were an atmosphere consisting 100% of hydrogen, 1200° C. and two hours. The other substrate was not heat-treated for comparison.

Oxygen ions are implanted with an accelerating energy of 180 keV and at a density of $1.5 \times 10^{18}$ $cm^{-2}$. The substrate was kept at a temperature of 550° C. during the ion implantation.

Subsequently, each substrate was heat-treated in an atmosphere of $O_2(10\%)/Ar(90\%)$ at 1350° C. for four hours.

Each substrate was completed as an SIMOX wafer (SOI wafer) of a single-crystal silicon semiconductor layer (SOI layer) 179 nm thick and a buried silicon oxide layer (BOX layer) 400 nm thick.

To detect COPs on a surface of the SOI layer, the SOI wafer was treated with an SC-1 cleaning liquid (a mixture liquid of 1.0 wt % of $NH_4OH$, 6.0 wt % of $H_2O_2$ and water) for ten minutes. The number of COPs (on the order of 0.1 to 0.2 $\mu$m) on the surface of the SOI wafer was counted using a surface particle detector (for example, SP-1 manufactured by KLA-Tencor Co., Ltd.)

The inspection indicated 200 COPs per unit wafer for the SOI wafer manufactured using the silicon substrate which has not been hydrogen-annealed.

On the other hand, the inspection indicated 5 COPs per unit wafer for the SOI wafer manufactured using the silicon substrate the CZ wafer of which had been hydrogen-annealed before implantation of oxygen ions. In this way, it was possible to sufficiently reduce in the SOI wafer the number of COPs which are the defects attributable to the CZ-Si substrate.

When the number of COPs per unit wafer was compared after removing surfaces approximately 79 nm thick were removed from the SOI layers by polishing or oxidation and peeling off oxide films, the surface particle detector indicated 250 COPs on the surface of the SOI wafer which had not been hydrogen-annealed and 7 COPs on the surface of the SOI wafer which had been hydrogen-annealed before implantation of oxygen ions.

Furthermore, formation of a protective layer by oxidizing a surface of an Si substrate before implantation of oxygen ions makes it possible to effectively prevent the surface from being roughened by implanting ions.

It is possible to reduce defects such as COPs by further annealing a silicon substrate with hydrogen after forming a BOX layer.

In addition, it is preferable to form a silicon oxide layer as a protective layer by thermally oxidizing a surface of a silicon substrate prior to formation of an ion-implantation layer. Though OSFs may be formed in a wafer and defects existing within a region to form an SOI layer produce influences on a final SOI layer when a silicon oxide layer is formed by thermally oxidizing an ordinary CZ wafer, the present invention which is configured to oxidize a surface of the surface layer 22 having been hydrogen-annealed is capable of preventing OSFs from being produced. It is considered that this effect is obtained because an oxygen concentration on the surface of the substrate is lowered by annealing the silicon substrate with hydrogen prior to the formation of a protective layer.

EXAMPLE 2

Seven single-crystal silicon substrates which were manufactured by the CZ method were prepared as silicon substrates and heat-treated in reducing atmospheres containing hydrogen in the conditions listed below:

(1) 1200° C. for one hour in 100% of $H_2$
(2) 1200° C. for two hours in 100% of $H_2$
(3) 1200° C. for four hours in 100% of $H_2$
(4) 1100° C. for four hours in 100% of $H_2$
(5) 1100° C. for four hours in 4% of $H_2$ and 96% of Ar
(6) 1150° C. for ten minutes in 100% of $H_2$
(7) not hydrogen-annealed before oxygen ion implantation A CZ wafer was not hydrogen-annealed for comparison.

Surface silicon oxide films 50 nm thick were formed by thermally oxidizing surfaces of surface layers of the silicon substrates subjected to the heat-treatments. The oxide films were formed to prevent the surfaces from being roughened by implanting ions. Needless to say, these oxide layers may not be formed as occasion demands.

$O^+$ ions were implanted through the surface silicon oxide films at a density of $2 \times 10^{18}$ $cm^{-2}$ at 180 keV. The ion implantation was conducted at a temperature of 550° C. By the ion implantation, there were formed surface layers which had a small number of defects as well as ion-implantation layers which had concentration peaks in the vicinities of interfaces between the surface layers and the original substrates.

Subsequently, the substrates were heat-treated at 1350° C. for four hours in an atmosphere of $O_2(10\%)/Ar$ (90%). By removing the surface oxide films, SOI wafers each consisting of single-crystal silicon semiconductor layer (SOI layer) 150 nm/buried silicon oxide layer 400 nm were completed.

To detect COPs on surfaces of the SOI layers, the SOI wafers were treated with an SC-1 cleaning liquid (a mixture liquid consisting of 1.0 wt % of $NH_4OH$, 6.0 wt % of $H_2O_2$ and water) for ten minutes. The numbers of COPs on surfaces of the SOI wafers was counted with a surface particle detector (for example, SP-1 manufactured by KLA-Tencor Co., Ltd.).

The inspection indicated 200 COPs per unit wafer for the SOI wafer manufactured with the silicon substrate which had not been hydrogen-annealed. On the other hand, the number of COPs on the SOI wafers treated in the conditions (1) through (6) was not larger than 20 though the numbers was more or less variable. The conditions (3) in particular permitted to obtain an SOI wafer which had three COPs and was substantially free from defects such as COPs.

After submerging the completed SOI substrates in 49% HF solution for ten minutes, they were observed through an optical microscope. When a COP exists in the SOI layer, an HF etches the silicon oxide layer through the COP and a circular defect which indicates an etched portion of the silicon oxide layer is observable. The SOI wafer which was treated in the conditions (7) where it was not heat-treated in the hydrogen atmosphere had HF defect on the order of $1.5/cm^2$, whereas the SOI wafer which was treated in the conditions (3) had the HF defect at $0.05/cm^2$.

EXAMPLE 3

A CZ-Si wafer which was heat-treated at 1200° C. for two hours in 100% of hydrogen as in (2) in EXAMPLE 2 was prepared.

$O^+$ ions were implanted through a surface silicon oxide layer to $2 \times 10^{17}$ $cm^{-2}$ at 180 keV. The CZ wafer was kept at a temperature of 550° C. during the ion implantation.

Subsequently, the substrate was heat-treated at 1350° C. for four hours in an atmosphere of $O_2(10\%)/Ar$ (90%). A buried silicon oxide film thus formed had a thickness on the order of 100 nm.

After cleaning the wafer, $O^+$ ions were implanted once again to $5 \times 10^{17}$ $cm^{-2}$ at 180 keV and the wafer was subjected to a similar heat-treatment. The cleaning, ion implantation and heat-treatment were repeated until oxygen was implanted in a total amount of $2 \times 10^{18}$ $cm^{-2}$.

By removing a surface oxide film, an SOI wafer of SOI layer 150 nm/buried silicon oxide layer 400 nm was completed.

The number of COPs on a surface of the SOI layer was measured as in EXAMPLE 1 and the measurement indicates COPs on the order of five per unit wafer, whereby the wafer was substantially free from defects such as COPs and FPDs attributable to the CZ-Si substrate.

EXAMPLE 4

An Si wafer which had a small number of defects on a surface was prepared by heat-treating a CZ-Si wafer in a hydrogen atmosphere as in (2) of EXAMPLE 2.

Furthermore, a silicon oxide film 20 nm thick was formed by thermal oxidation on a surface of a single-crystal silicon layer (SOI layer) which formed a surface of the wafer.

$O^+$ ions were implanted through the surface silicon oxide film to $4 \times 10^{17}$ $cm^{-2}$ at 180 keV. The wafer was kept at a temperature of 550° C. during the ion implantation.

Subsequently, the ion-implantation layer was changed into a buried silicon oxide layer by heat-treating the substrate at 1350° C. for four hours in an atmosphere of $O_2(10\%)/Ar$ (90%). A wafer consisting of SOI layer 300 nm/buried silicon oxide layer 90 nm was completed in this way.

Subsequently, the wafer was further heat-treated at 1350° C. for four hours in an atmosphere of $O_2(70\%)/Ar$ (30%). By removing a surface oxide film from the SOI layer, an SOI wafer consisting of SOI layer 175 nm/buried silicon oxide layer 110 nm was completed.

Since the SOI layer was a portion of a single-crystal silicon layer in which defects were reduced by the heat-treatment in the hydrogen atmosphere, the SOI wafer had defects such as COPs and FPDs on the order of five per unit wafer.

EXAMPLE 5

An Si substrate was prepared by treating an Sb doped n type silicon wafer which had specific resistance of 0.005 $\Omega\cdot cm$ (100) at 1200° C. for two hours in 100% of hydrogen.

Furthermore, a silicon oxide film 50 nm thick was formed by thermal oxidation on a surface of the substrate.

$O^+$ ions were implanted through the silicon oxide film on the surface of the wafer to $4\times10^{17}$ $cm^{-2}$ at 180 keV. The wafer was kept at a temperature of 550° C. during the ion implantation.

Subsequently, the wafer was heat-treated at 1350° C. for four hours in an atmosphere of $O_2(10\%)/Ar$ (90%). An SOI wafer consisting of SOI layer 300 nm/buried oxide film 90 nm was thus completed.

The SOI wafer was further heat-treated at 1350° C. for four hours in an atmosphere of $O_2(70\%)/Ar(90\%)$. By removing the oxide film from the surface of the wafer, an SOI wafer consisting of SOI layer 200 nm/buried oxide film 120 nm was completed.

The SOI layer of the SOI wafer was substantially free from defects such as COPs and FPDs which were attributable to a CZ-Si substrate.

EXAMPLE 6

A P+ type Cz-Si wafer having specific resistance of 0.01 $\Omega\cdot cm$ was prepared.

The wafer was hydrogen-annealed by heat-treating at 1200° C. for two hours in 100% of $H_2$.

Furthermore, an $SiO_2$ layer 50 nm thick was formed by thermal oxidation on a surface of the substrate. $O^+$ ions were implanted through the surface silicon oxide film to $2\times10^{18}$ $cm^{-2}$ at 180 keV. The substrate was kept at a temperature of 550° C. during the ion implantation.

Subsequently, the substrate was heat-treated at 1350° C. for four hours in an atmosphere of $O_2(10\%)/Ar$ (90%). By removing the surface silicon oxide film, an SOI wafer consisting of SOI layer 150 nm/buried oxide film 400 nm was completed.

The SOI layer was substantially free from defects such as COPs and FPDs which were attributable to the CZ-Si substrate.

Subsequently, the SOI wafer was heat-treated in an atmosphere of 100% of highly pure hydrogen which was purified with a hydrogen refiner using palladium alloy (1100° C., 4 h). A measurement of surface roughness of this SOI wafer indicated that roughness at root mean square was improved from Rrms=0.5 nm before the heat-treatment to 0.3 nm.

Furthermore, a boron concentration in the SOI wafer which was $2\times10^{18}/cm^3$ before the heat-treatment was lowered to a level not higher than $5\times10^{15}/cm^3$ after the heat-treatment in the SOI layer.

After an SOI layer is formed, it is preferable to anneal its surface with hydrogen also from the viewpoint to lower roughness on the surface and densities of impurities in a substrate.

What is claimed is:

1. A method for manufacturing a semiconductor substrate comprising the steps of:
   preparing a hydrogen-annealed single-crystal silicon substrate;
   forming an ion-implantation layer by implanting ions in said single-crystal silicon substrate; and
   forming a buried insulating film in said single-crystal silicon substrate.

2. The method for manufacturing a semiconductor substrate according to claim 1, wherein a protective layer is formed on said single-crystal silicon substrate after said hydrogen-annealed single-crystal silicon substrate is prepared and before said ion-implantation layer is formed, and ions are implanted from the side of said protective layer.

3. The method for manufacturing a semiconductor substrate according to claim 1 or 2, wherein said hydrogen-annealed single-crystal silicon layer is a substrate which has a less defective layer on the surface thereof.

4. The method for manufacturing a semiconductor substrate according to claim 3, said less defective layer is a layer which has COPs (crystal originated particles) or FDPs (flow pattern defects) or OSFs (oxidation induced stacking faults) in a number smaller than that in other regions in the single-crystal silicon substrate.

5. The method for manufacturing a semiconductor substrate according to claim 1 or 2, wherein said step of preparing a hydrogen-annealed single-crystal silicon substrate is a step of heat-treating a single-crystal silicon substrate in a reducing atmosphere containing hydrogen.

6. The method for manufacturing a semiconductor substrate according to claim 5, wherein said reducing atmosphere containing hydrogen is a 100% gas of hydrogen or a mixture gas of hydrogen and a rare gas or a mixture gas of hydrogen and nitrogen.

7. The method for manufacturing a semiconductor substrate according to claim 1 or 2, wherein said hydrogen-annealing is carried out at a temperature which is not lower than 800° C. and not higher than a melting point of silicon.

8. The method for manufacturing a semiconductor substrate according to claim 1 or 2, wherein said hydrogen-annealing is carried out at a temperature in a range between higher than 1000° C. and not higher than melting point of silicon.

9. The method for manufacturing a semiconductor substrate according to claim 1 or 2, comprising a step of cleaning said single-crystal silicon substrate before forming said ion-implantation layer.

10. The method for manufacturing a semiconductor substrate according to claim 1 or 2, wherein said single-crystal silicon substrate is a CZ silicon wafer.

11. The method for manufacturing a semiconductor substrate according claim 1 or 2, wherein said single-crystal silicon substrate is an MCZ silicon wafer.

12. The method for manufacturing a semiconductor substrate according to claim 3, wherein the number of COPs per unit area on a surface of said less defective layer is not smaller than $0/cm^2$ and not larger than $1.6/cm^2$.

13. The method for manufacturing a semiconductor substrate according to claim 3, wherein the number of COPs per unit area on a surface of said less defective layer is not smaller than $0/cm^2$ and not larger than $0.5/cm^2$.

14. The method for manufacturing a semiconductor substrate according to claim 3, wherein the number of COPs per unit area on said less defective layer is not smaller than $0/cm^2$ and not larger than $0.05/cm^2$.

15. The method for manufacturing a semiconductor substrate according to claim 3, wherein the number of COPs per unit wafer on a surface of said less defective layer is not smaller than 0 and not larger than 100.

16. The method for manufacturing a semiconductor substrate according to claim 3, wherein the number of COPs per unit wafer on a surface of said less defective layer is not smaller than 0 and not larger than 50.

17. The method for manufacturing a semiconductor substrate according to claim 3, wherein the number of COPs per unit wafer on a surface of said less defective layer is not smaller than 0 and not larger than 10.

18. The method for manufacturing a semiconductor substrate according to claim 3, wherein an oxygen density on a surface of said less defective layer is not higher than $5 \times 10^{17}$ atoms/cm$^3$.

19. The method for manufacturing a semiconductor substrate according to claim 2, wherein said protective layer formed on said single-crystal silicon substrate is a silicon oxide layer or a silicon nitride layer.

20. The method for manufacturing a semiconductor substrate according to claim 1 or 2, wherein said ion-implantation layer is formed by implanting oxygen ions or nitrogen ions.

21. The method for manufacturing a semiconductor substrate according to claim 1 or 2, wherein said ion-implantation layer is formed by implanting the ions within a range from $1.0 \times 10^{16}$/cm$^2$ to $1.0 \times 10^{19}$/cm$^2$.

22. The method for manufacturing a semiconductor substrate according to claim 1 or 2, wherein said ion-implantation layer is formed by a plasma immersion ion implantation process.

23. The method for manufacturing a semiconductor substrate according to claim 1 or 2, wherein said buried insulating film is formed by heat-treating said single-crystal silicon substrate in which said ion-implantation layer is formed.

24. The method for manufacturing a semiconductor substrate according to claim 1 or 2, wherein said single-crystal silicon substrate is heat-treated in an oxidizing atmosphere after said buried insulating film is formed.

25. The method for manufacturing a semiconductor substrate according to claim 1 or 2, wherein said silicon substrate is subjected to a surface treatment after said buried insulating film is formed.

26. The method for manufacturing a semiconductor substrate according to claim 25, wherein said surface treatment is polishing and/or hydrogen-annealing of a surface of said silicon substrate.

27. A method for manufacturing a semiconductor substrate comprising the steps of:
preparing a hydrogen-annealed single-crystal silicon substrate at a temperature in a range between higher than 1000° C. and not higher than melting point of silicon;
forming an ion-implantation layer by implanting oxygen ions in said single-crystal silicon substrate; and
forming a buried silicon oxide film in said single-crystal silicon substrate.

28. The method for manufacturing a semiconductor substrate according to claim 27, wherein a thermally oxidized silicon film is previously formed as a protective layer on a hydrogen-annealed single-crystal silicon substrate and then ions are implantated from a side of said thermally oxidized silicon film.

29. A method for manufacturing a semiconductor substrate comprising the steps of:
preparing a hydrogen-annealed single-crystal silicon substrate;
forming an ion-implantation layer by implanting oxygen ions in said single-crystal silicon substrate;
forming a buried silicon oxide film in said single-crystal silicon substrate by a first heat-treatment in a non-oxidizing atmosphere; and
carrying out a second heat-treatment of said single-crystal silicon substrate in an oxidizing atmosphere after said buried silicon oxide film is formed.

30. The method for manufacturing a semiconductor substrate according to claim 29, wherein oxygen has been added to said non-oxidizing atmosphere in a volume ratio of 1% or less.

31. A semiconductor substrate obtained by the method according to any one of claim 1, 2, 27, 28, 29 or 30.

32. A semiconductor substrate obtained by the method according to claim 3.

33. A semiconductor substrate obtained by the method according to claim 4.

34. A semiconductor substrate obtained by the method according to claim 5.

35. A semiconductor substrate obtained by the method according to claim 6.

36. A semiconductor substrate obtained by the method according to claim 7.

37. A semiconductor substrate obtained by the method according to claim 8.

38. A semiconductor substrate obtained by the method according to claim 9.

39. A semiconductor substrate obtained by the method according to claim 10.

40. A semiconductor substrate obtained by the method according to claim 11.

41. A semiconductor substrate obtained by the method according to claim 12.

42. A semiconductor substrate obtained by the method according to claim 13.

43. A semiconductor substrate obtained by the method according to claim 14.

44. A semiconductor substrate obtained by the method according to claim 15.

45. A semiconductor substrate obtained by the method according to claim 16.

46. A semiconductor substrate obtained by the method according to claim 17.

47. A semiconductor substrate obtained by the method according to claim 18.

48. A semiconductor substrate obtained by the method according to claim 19.

49. A semiconductor substrate obtained by the method according to claim 20.

50. A semiconductor substrate obtained by the method according to claim 21.

51. A semiconductor substrate obtained by the method according to claim 22.

52. A semiconductor substrate obtained by the method according to claim 23.

53. A semiconductor substrate obtained by the method according to claim 24.

54. A semiconductor substrate obtained by the method according to claim 25.

55. A semiconductor substrate obtained by the method according to claim 26.

* * * * *

UNITED STATES PATENT AND TRADEMARK OFFICE
CERTIFICATE OF CORRECTION

PATENT NO.     : 6,313,014 B1
DATED          : November 6, 2001
INVENTOR(S)    : Kiyofumi Sakaguchi et al.

It is certified that error appears in the above-identified patent and that said Letters Patent is hereby corrected as shown below:

<u>Title page,</u>
Item [56], OTHER PUBLICATIONS, "Nol. 16," should read -- No. 16, --.
Item [56], FOREIGN PATENT DOCUMENTS, "62-123098 6/1996" should read -- 62-123098 6/1987 --.

<u>Column 1,</u>
Line 26, "integrate" should read -- integrated --.

<u>Column 6,</u>
Line 38, "for" should read -- of --; and
Line 47, "considering into" should read -- taking into --.

<u>Column 11,</u>
Line 66, "the that" should read -- that the --.

<u>Column 12,</u>
Line 67, "times" should read -- time --.

<u>Column 18,</u>
Line 52, "according" should read -- according to --.

<u>Column 20,</u>
Line 15, "claim" should read -- claims --.

Signed and Sealed this

Twenty-fifth Day of June, 2002

*Attest:*

*Attesting Officer*

JAMES E. ROGAN
*Director of the United States Patent and Trademark Office*